(12) United States Patent
Garcia et al.

(10) Patent No.: US 8,232,858 B1
(45) Date of Patent: Jul. 31, 2012

(54) MICROELECTROMECHANICAL (MEM) THERMAL ACTUATOR

(75) Inventors: Ernest J. Garcia, Albuquerque, NM (US); Clay W. G. Fulcher, Sandia Park, NM (US)

(73) Assignee: Sandia Corporation, Albuquerque, NM (US)

( * ) Notice: Subject to any disclaimer, the term of this patent is extended or adjusted under 35 U.S.C. 154(b) by 476 days.

(21) Appl. No.: 12/033,995

(22) Filed: Feb. 20, 2008

(51) Int. Cl.
*H01H 61/00* (2006.01)
*H01H 71/16* (2006.01)
*H01H 37/52* (2006.01)
*H01L 21/00* (2006.01)

(52) U.S. Cl. .............. 337/36; 337/85; 337/333; 337/89; 337/365; 438/52

(58) Field of Classification Search .............. 337/36, 337/333, 365, 85, 89; 438/52
See application file for complete search history.

(56) References Cited

U.S. PATENT DOCUMENTS

| | | | |
|---|---|---|---|
| 5,804,084 A | 9/1998 | Nasby et al. | |
| 5,867,302 A * | 2/1999 | Fleming | 359/291 |
| 5,909,078 A * | 6/1999 | Wood et al. | 310/307 |
| 5,959,375 A | 9/1999 | Garcia et al. | |
| 5,994,816 A * | 11/1999 | Dhuler et al. | 310/307 |
| 6,023,121 A * | 2/2000 | Dhuler et al. | 310/307 |
| 6,082,208 A | 7/2000 | Rodgers et al. | |
| 6,100,477 A * | 8/2000 | Randall et al. | 200/181 |
| 6,114,794 A * | 9/2000 | Dhuler et al. | 310/307 |
| 6,239,685 B1 * | 5/2001 | Albrecht et al. | 337/365 |
| 6,303,885 B1 * | 10/2001 | Hichwa et al. | 200/181 |
| 6,333,583 B1 * | 12/2001 | Mahadevan et al. | 310/306 |
| 6,360,539 B1 * | 3/2002 | Hill et al. | 60/528 |
| 6,388,359 B1 * | 5/2002 | Duelli et al. | 310/309 |
| 6,703,916 B2 * | 3/2004 | Charvet et al. | 337/141 |
| 6,753,582 B2 * | 6/2004 | Ma | 257/415 |
| 6,853,765 B1 | 2/2005 | Cochran | |
| 6,911,891 B2 * | 6/2005 | Qiu et al. | 337/53 |
| 6,960,971 B2 * | 11/2005 | Park et al. | 333/262 |
| 6,982,515 B2 * | 1/2006 | Howell et al. | 310/307 |
| 6,983,088 B2 | 1/2006 | Kubby et al. | |
| 6,985,650 B2 | 1/2006 | Ma et al. | |
| 6,985,651 B2 | 1/2006 | Ma et al. | |
| 7,011,288 B1 * | 3/2006 | Slicker et al. | 251/11 |

(Continued)

OTHER PUBLICATIONS

Cao. A., et al., "Bi-directional electrothermal electromagnetic actuators", J. Micromech. Microeng. vol. 17, pp. 975-982, 2007.

(Continued)

*Primary Examiner* — Bradley Thomas
(74) *Attorney, Agent, or Firm* — Olivia J. Tsai

(57) ABSTRACT

Microelectromechanical (MEM) buckling beam thermal actuators are disclosed wherein the buckling direction of a beam is constrained to a desired direction of actuation, which can be in-plane or out-of-plane with respect to a support substrate. The actuators comprise as-fabricated, linear beams of uniform cross section supported above the substrate by supports which rigidly attach a beam to the substrate. The beams can be heated by methods including the passage of an electrical current through them. The buckling direction of an initially straight beam upon heating and expansion is controlled by incorporating one or more directional constraints attached to the substrate and proximal to the mid-point of the beam. In the event that the beam initially buckles in an undesired direction, deformation of the beam induced by contact with a directional constraint generates an opposing force to re-direct the buckling beam into the desired direction. The displacement and force generated by the movement of the buckling beam can be harnessed to perform useful work, such as closing contacts in an electrical switch.

15 Claims, 7 Drawing Sheets

U.S. PATENT DOCUMENTS

| | | | |
|---|---|---|---|
| 7,012,491 B1* | 3/2006 | Geisberger et al. | 335/78 |
| 7,038,150 B1 | 5/2006 | Polosky et al. | |
| 7,075,209 B2* | 7/2006 | Howell et al. | 310/309 |
| 7,221,817 B2 | 5/2007 | German et al. | |
| 7,268,653 B2* | 9/2007 | Bouche | 335/78 |
| 7,283,030 B2 | 10/2007 | Cabal et al. | |
| 7,289,009 B1 | 10/2007 | Christenson et al. | |
| 7,339,454 B1* | 3/2008 | Fleming | 337/141 |
| 2002/0102061 A1 | 8/2002 | Lang | |
| 2002/0170290 A1* | 11/2002 | Bright et al. | 60/527 |
| 2003/0006125 A1* | 1/2003 | Hallbjorner | 200/36 |
| 2003/0210115 A1 | 11/2003 | Kubby et al. | |
| 2004/0032000 A1* | 2/2004 | Ma | 257/415 |
| 2006/0034562 A1* | 2/2006 | German et al. | 385/16 |
| 2006/0109075 A1* | 5/2006 | Cabal et al. | 337/333 |
| 2006/0152328 A1* | 7/2006 | Robert | 337/333 |
| 2006/0274470 A1* | 12/2006 | Srinivasan et al. | 361/103 |
| 2008/0002930 A1* | 1/2008 | German et al. | 385/16 |
| 2009/0146773 A1* | 6/2009 | Kang | 337/123 |

OTHER PUBLICATIONS

Venditti, R., et al., "An in-plane, bi-directional electrothermal MEMS actuator", J. Micromech. Microeng. vol. 16, pp. 2067-2070, 2006.

Qiu, J., et al., "A Bulk-Micromachined Bistable Relay With U-Shaped Thermal Actuators", J. Microelectromech. Syst., vol. 14, No. 5, pp. 1099-1109, Oct. 2005.

Chen, W., et al., "A reliable single-layer out-of-plane micromachined thermal actuator", Sensors and Actuators A, 103, pp. 48-58, 2003.

Que, L., et al., "Bent-Beam Electrothermal Actuators—Part I:Single Beam and Cascaded Devices", J. Microelectromech. Syst., vol. 10, No. 2, Jun. 2001.

Que, L. et al., "Pulse and DC Operation Lifetimes of Bent-Beam ElectroThermal Actuators", Tech Dig.: MEMS 14th IEEE Int Conf. on Micro Electro Mech. Syst., Piscataway, NJ, USA, pp. 570-573, 2001.

Chiao, M. et al., "Self-Buckling of Micromachined Beams Under Resistive Heating", J. Microelectromech. Syst., vol. 9, No. 1, pp. 146-151, Mar. 2000.

Lin, L. et al., "Vertically driven microactuators by electrothermal buckling effects", Sensors and Actuators A, 71, pp. 35-39, 1998.

Garcia, E., "Micro-Flex Mirror and Instability Actuation Technique", Proceedings of the 11th Annual International Workshop on Micro Electro mechanical Systems (MEMS), Heidelberg, Germany, pp. 470-475, Jan. 25-29, 1998.

Comtois, J.H., et al., "Applications for surface-micromachined polysilicon thermal actuators and arrays", Sensors and Actuators A, 58, pp. 19-25, 1997.

Guckel, H., et al., "Thermo-Magnetic Flexure Actuators", Tech. Dig.:IEEE Solid-State Sensor and Actuator Workshop, New York, USA, pp. 73-75, 1992.

"SUMMiT V(TM), Five level Surface Micromachining Technology Design Manual", Version 3.0, Jan. 18, 2007, [online] [retrieved on Jan. 14, 2008] retrieved from the Internet: <URL:http://www.mems.sandia.gov/sample/doc/SUMMiT_V_Dmanual_V3.0.pdf>.

* cited by examiner

MICROELECTROMECHANICAL (MEM) THERMAL ACTUATOR

STATEMENT REGARDING FEDERALLY SPONSORED RESEARCH OR DEVELOPMENT

The United States Government has certain rights in this invention pursuant to Department of Energy Contract No. DE-AC04-94AL85000 with Sandia Corporation.

FIELD OF THE INVENTION

The invention generally relates to microelectromechanical (MEM) thermal actuators. The invention additionally relates to MEM thermal actuators comprising beams, mechanically fixed at both ends and heated to induce expansion and eventual buckling of the beam, the buckling motion of the beam producing a force and displacement for the desired actuation. The invention further relates to MEM thermal actuators of the buckling beam type, wherein the buckling direction of the beam is mechanically constrained to the desired direction of actuation, which can be in the plane of, or out of the plane of, a support substrate.

BACKGROUND OF THE INVENTION

The invention generally relates to thermal actuators of the buckling beam type, fabricated by microelectromechanical (MEM) technologies. Microelectromechanical (MEM) fabrication technologies, including surface micromachining methods based on integrated circuit (IC) manufacturing (e.g. semiconductor device manufacture), bulk micromachining, focused ion beam (FIB) processing, deep reactive ion etching (DRIE), LIGA (an acronym based on the first letters of the German words for lithography, electroplating and molding) and their combination, can be used to form microelectromechanical devices such as microsensors and microactuators, including buckling beam thermal actuators.

Dimensions of structures fabricated by MEM technologies can range from on the order of 0.1 μm, to on the order of a few millimeters, and include silicon, polysilicon, glass, dielectric and metallic structures that are either unsupported (i.e. free standing) or alternatively can be adhered to a substrate, or built up upon a substrate during manufacture. Substrates can comprise ceramics, glass-ceramics, low-temperature co-fireable ceramics (LTCC), quartz, glass, printed wiring boards (e.g. manufactured of polymeric materials including polytetrafluoroethylene, polyimide, epoxy, glass filled epoxy), silicon (e.g. silicon wafers), silicon on insulator (e.g. SOD substrates and metals. Dielectric layers for example, polymeric, silicon-oxide, silicon-nitride, glass and ceramic layers can be applied to the surface of conductive substrates (e.g. metallic and silicon substrates) to electrically isolate individual MEM elements within a fabricated structure, or isolate MEM elements from the substrate.

An exemplary surface micromachining technology is the Sandia Ultra-planar Multi-level MEMS Technology (SUMMiT™) available at Sandia National Laboratories, Albuquerque, N. Mex., wherein multiple polysilicon and dielectric layers are used to form mechanical structures on a silicon substrate, as described in the commonly owned patents, U.S. Pat. No. 5,804,084 to R. Nasby et al., and U.S. Pat. No. 6,082,208 to M. Rodgers et al., the entirety of their disclosures herein incorporated by reference. Additionally as described in the design guide "SUMMiT V™, Five level Surface Micromachining Technology Design Manual", Version 3.0, Jan. 18, 2007, [online] [retrieved on Jan. 14, 2008] retrieved from the Internet: <URL:http://www.mems.sandia.gov/sample/doc/SUMMiT_V_Dmanual_V3.0.pdf>, the entirety of the disclosure incorporated herein by reference, structural elements (e.g. buckling beams) can be fabricated utilizing up to five layers (or combinations thereof) of patterned polysilicon with the individual polysilicon layers ranging in thickness from approximately 0.3 μm up to approximately 2.25 μm, and dielectric layers comprising silicon oxides and silicon nitride layers ranging from approximately 0.63 μm up to approximately 2.0 μm per dielectric layer.

Structural elements formed from layers that are thicker than typically available in a multi-level polysilicon technology, can comprise single crystal silicon structural elements fabricated using silicon on insulator (SOI) substrates and surface micromachining methods as described in commonly owned patents, U.S. Pat. No. 7,289,009 to T. Christenson et al., and U.S. Pat. No. 7,038,150 to M. Polosky et al., the entirety of their disclosures herein incorporated by reference. SOI substrates can comprise a base layer of up to approximately 500 μm of single crystalline silicon, and a dielectric layer of up to 200 μm silicon oxide (e.g. $SiO_2$) insulating the base layer of silicon from a second layer of single crystal silicon that can be up to approximately 500 μm thick. Thicker structural elements, as for example incorporated into a buckling beam thermal actuator, can provide correspondingly greater actuation forces. Within the context of this disclosure, silicon oxide refers to oxides of silicon that may either be thermally grown or deposited by chemical vapor deposition methods and can comprise the stoichiometric composition ($SiO_2$) as well as non-stoichiometric compositions ($SiO_x$).

MEM buckling beam thermal actuators generally comprise an elongated member, for example a beam formed by patterning one or more layers of polysilicon or a layer of single crystal silicon, which is rigidly attached to a substrate, for example a silicon base, by dielectric supports at each end of the beam. Heating the beam, for example by passing an electrical current through it, causes the beam to expand and eventually buckle. The force generated by the buckling motion of the beam, generally in a direction perpendicular to its length, can be harnessed to perform useful work as an actuator. An issue for buckling beam thermal actuators is controlling (i.e. constraining) the buckling direction of the beam to be in the desired direction of actuation for the actuator. For example, initially straight beams of uniform cross-section along their length can buckle in more than one direction, and measures need be undertaken to insure that such a beam buckles, i.e. provides actuation, in the direction desired.

Methods to control the actuation direction of MEM thermal actuators include forming the elongated element in an initial shape such as a "V-beam", a chevron shape or a curved shape, producing a beam with variable cross-sections, and coupling an array of beams of differing cross-sections. These approaches can add complexity to the processes used to fabricate thermal actuators. Embodiments of the present invention overcome these difficulties by incorporating a directional constraint element which acts as a mechanical stop and/or limiter, to ensure buckling occurs in the desired direction of actuation.

BRIEF DESCRIPTION OF THE DRAWINGS

The accompanying drawings, which are incorporated in and form part of the specification, illustrate several embodiments of the present invention and, together with the description, serve to explain the principles of the invention. The drawings provided herein are not drawn to scale.

DETAILED DESCRIPTION OF THE INVENTION

The following examples describe embodiments of the invention as can be fabricated in a surface micromachining technology such as the Sandia Ultra-planar Multi-level MEMS Technology (SUMMiT™) available at Sandia National Laboratories, Albuquerque, N. Mex. and other MEM fabrication technologies including surface micromachining as applied to silicon on insulator (SOI) substrates. Alternative MEM technologies (e.g. as discussed above) can be utilized as well in the practice of the invention.

Figure 1A:
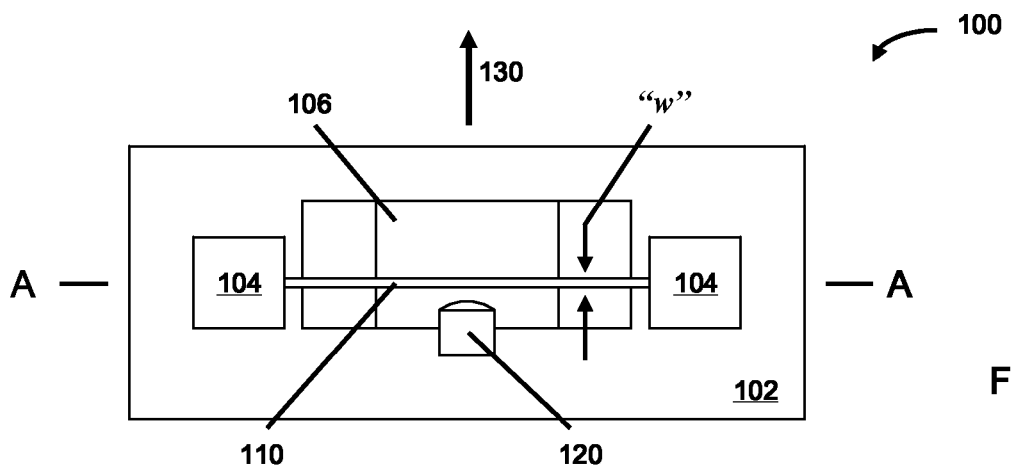
FIG. 1A is a plan schematic view of an embodiment of a MEM buckling beam thermal actuator according to the present invention.

FIG. 1A is a plan schematic view of an embodiment of a MEM buckling beam thermal actuator according to the present invention. In this exemplary embodiment, MEM buckling beam thermal actuator 100 is presumed to be fabricated in a technology such as the Sandia Ultra-planar Multi-level MEMS Technology (SUMMiT™) technology. MEM buckling beam thermal actuator 100 comprises a silicon substrate 102 upon (and into) the surface of which mechanical structures can be fabricated by the successive deposition and patterning of polysilicon and dielectric layers. Supports 104 are attached to the surface of the substrate and serve to support an elongated element 110 above the surface of the substrate 102. Elongated element 110 (e.g. a beam) and supports 104 can comprise (e.g. be built up from) successively deposited and patterned layers of polysilicon (doped or un-doped), dielectrics (e.g. silicon nitride, silicon oxide) and metals (e.g. aluminum, copper, nickel). Elongated element 110 can for example, comprise a beam of doped polysilicon that can function as a resistively heated element upon the passage of an electrical current through its length. In this and other embodiments of the invention the elongated element 110 can be as-fabricated in the simple straight form as illustrated (e.g. as a linear beam) of uniform cross-section. As discussed below, a directional constraint element 120 is incorporated to ensure the actuator 100 provides a direction of actuation 130 in a pre-determined, i.e. desired direction.

Figure 1B:
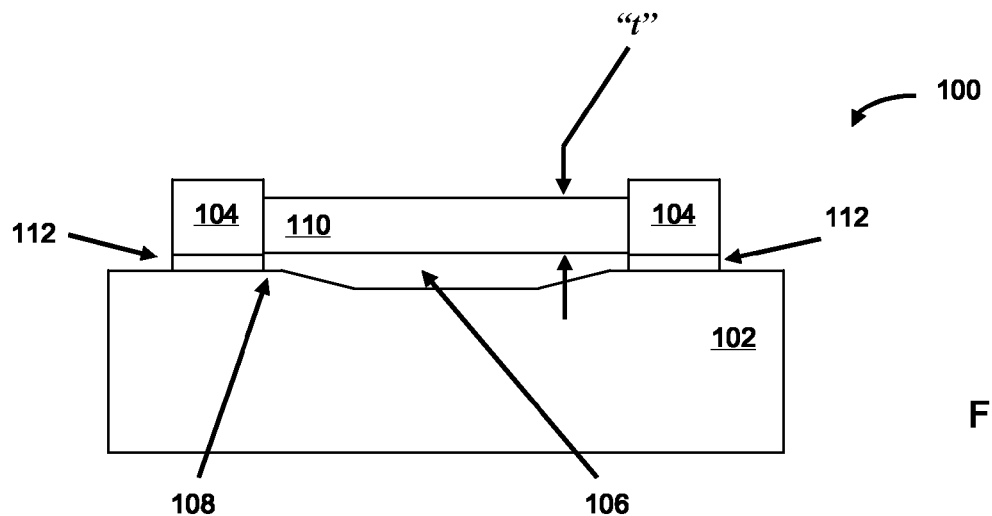
FIG. 1B is a schematic cross-sectional view of an embodiment of the MEM thermal actuator according to FIG. 1A.

FIG. 1B is a schematic cross-sectional view of an embodiment of the MEM thermal actuator according to FIG. 1A, through the section line A-A. Supports 104 disposed at each end of the elongated element 110 rigidly connect the elongated element 110 to the substrate 102 and provide for a clearance space 108 (e.g. a gap) between the elongated element 110 and the substrate 102. Supports 104 can comprise built up layers of polysilicon and can be electrically isolated from the substrate 102 by means of a dielectric layer 112 (e.g. comprising silicon oxide and/or silicon nitride). Supports 104 can comprise doped polysilicon and/or metallic materials for the purpose of providing electrical connectivity to the elongated element 110. A recess 106 (e.g. an etched well or depression) can be incorporated into the substrate 102 adjacent to the elongated element 110 for the purpose of reducing thermal energy losses from the elongated element 110 to the substrate 102. Comparison of FIGS. 1A and 1B illustrate that the cross-section (e.g. given by "w" and "t") of the elongated element 110 can be arranged so that the greater dimension ("t") is perpendicular to the direction of actuation 130, to facilitate flexure and buckling of the elongated element 110 in the desired direction of actuation 130.

Figure 1C:
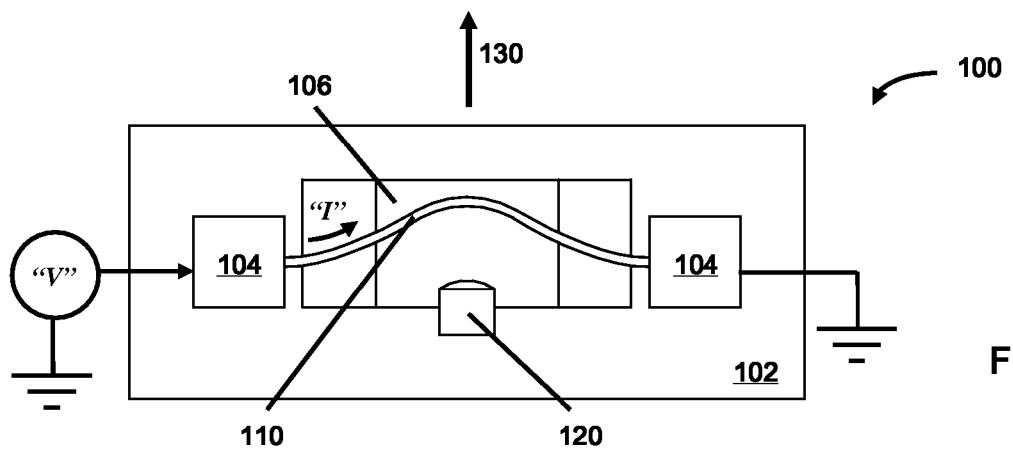
FIG. 1C is a plan schematic view of an embodiment of the MEM thermal actuator according to FIG. 1A, wherein the buckling direction of the beam is in the desired direction of actuation.

FIG. 1C is a plan schematic view of an embodiment of the MEM thermal actuator according to FIG. 1A, wherein the buckling direction of the beam is in the desired direction of actuation. Applying a voltage ("V") across the elongated element 110 for example by means of supports 104 (e.g. acting as electrical contact pads) causes an electrical current ("I") to flow through the elongated element 110 that causes the elongated element 110 to resistively heat and expand. However, as the supports 104 serve to pin the ends of the elongated element 110 to the substrate, the elongated element 110 is forced into a mechanical instability and buckles, moving the center portion of the elongated element 110 outward and in the direction of actuation 130. As described below, this movement of the center portion of the elongated element 110 produces a force in the actuation direction 130 which can be harnessed to perform useful work. When the voltage ("V") is removed, resistive heating of the elongated element 110 ceases and the elongated element 110 returns to its initially straight form as illustrated in FIG. 1A. Elongated element 110 could as well be heated indirectly by application of a separate resistively heated layer (e.g. the elongated element could comprise multiple layers) or by optical energy, for example by illumination from a heating lamp or a laser, or could as well be heated convectively by the flow of a heated gas over its length.

The above description illustrates an elongated element 110 that is as-fabricated in a substantially straight form (e.g. a linear beam) of substantially uniform cross-section, expanding and buckling in the desired direction of actuation 130. However, due to manufacturing tolerances and other environmental factors, the possibility exists that the initially straight elongated element 110 could expand in a direction opposed to the desired direction of actuation 130. The utility of the directional constraint 120 becomes apparent in the following description of FIGS. 2A through 2D.

Figure 2A:
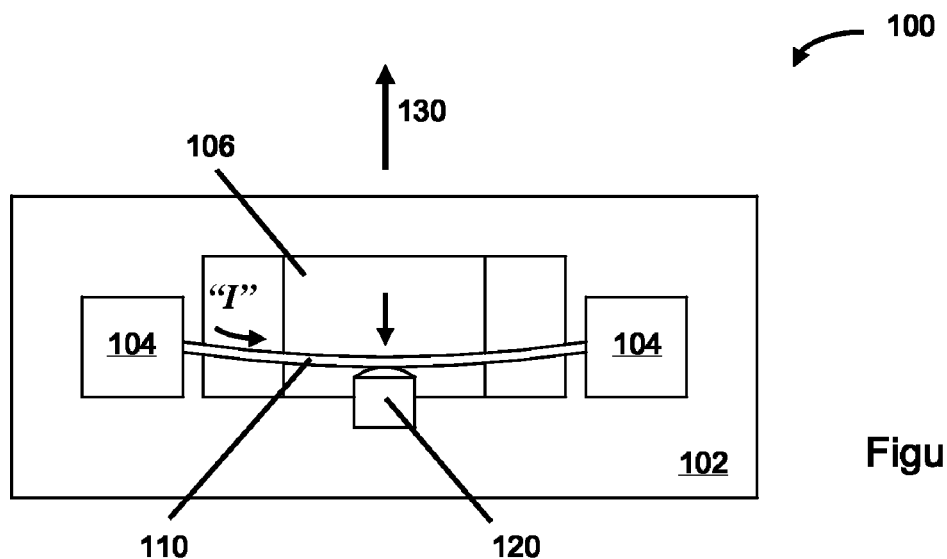
FIG. 2A is a plan schematic view of an embodiment of the MEM thermal actuator according to FIG. 1A, wherein the onset of buckling is in a direction not aligned with the desired direction of actuation.

FIG. 2A is a plan schematic view of an embodiment of the MEM thermal actuator according to FIG. 1A, wherein the onset of buckling is in a direction not aligned with the desired direction of actuation. In this example, application of a voltage ("V", not shown) across the elongated element 110 causes current ("I") to flow through the elongated element 110 heating the elongated element 110 which expands and buckles, in a direction not aligned to the desired direction of actuation 130. Due to the pinning constraint of the supports 104, the elongated element 110 buckles outwardly and contacts the directional constraint 120. Directional constraint 120 can comprise a block or end stop affixed to the substrate, fabricated of deposited and patterned layers of polysilicon and/or dielectrics such as silicon oxide and silicon nitride, and can comprise a substantially thermally and/or electrically isolated structure from the substrate 102. In this example, directional constraint 120 is illustrated as a rectangular feature with a curved or pointed surface to minimize the contact area engaging the elongated element 110. The directional constraint 120 can be positioned proximal to the center along the length of the elongated element 110, but the precise location is not critical to the practice of the invention.

Figure 2B:
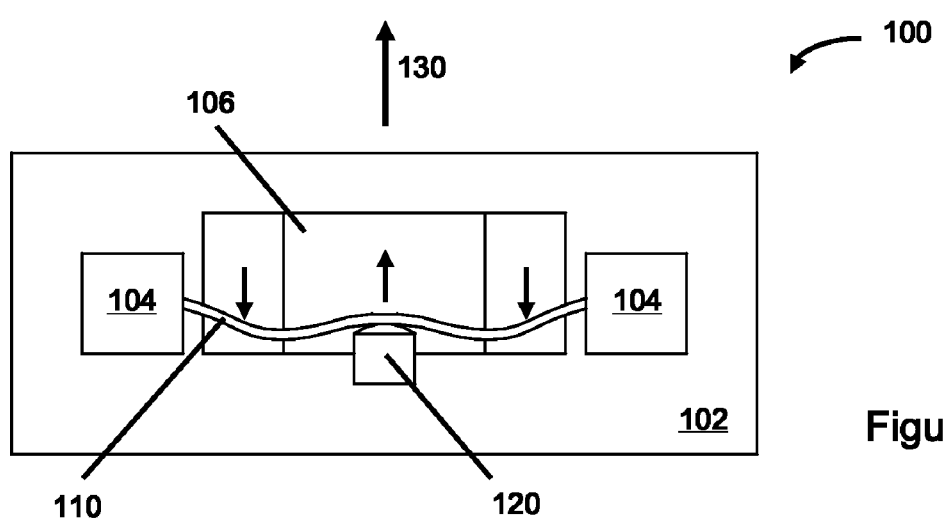
FIG. 2B is a plan schematic view of an embodiment of the MEM thermal actuator according to FIG. 2A, wherein buckling is occurring in a direction not aligned with the desired direction of actuation.

FIG. 2B is a plan schematic view of an embodiment of the MEM thermal actuator according to FIG. 2A, wherein buckling is occurring in a direction not aligned with the desired direction of actuation. Continued heating and expansion of the elongated element 110 causes the elongated element 110 to deform over the directional constraint 120. As illustrated, the directional constraint 120 induces a reverse curvature near the center portion of the elongated element 110 thereby producing a force opposing continued motion of the elongated element 110 in the undesired direction.

Figure 2C:
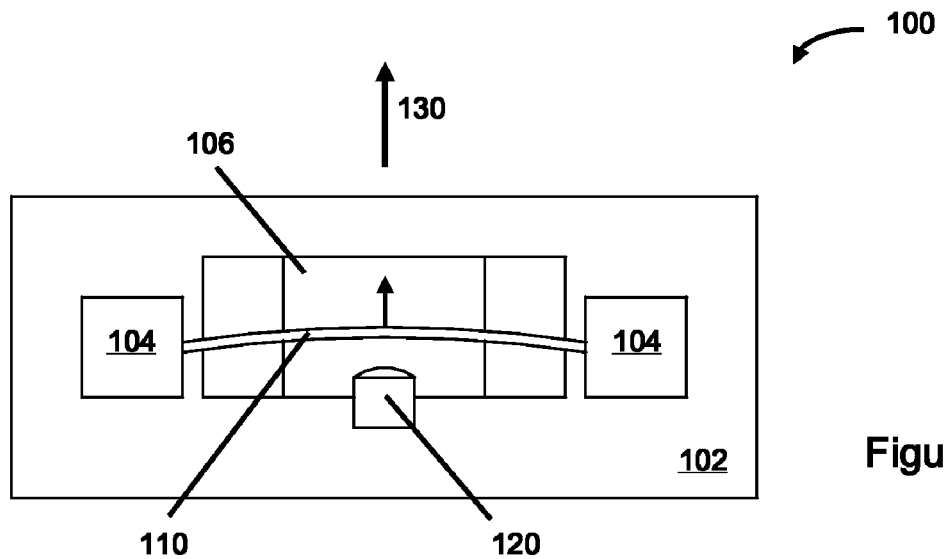
FIG. 2C is a plan schematic view of an embodiment of the MEM thermal actuator according to FIG. 2B, wherein the buckling direction has been constrained to occur in the desired direction of actuation.

FIG. 2C is a plan schematic view of an embodiment of the MEM thermal actuator according to FIG. 2B, wherein the buckling direction has been constrained (e.g. re-directed) to occur in the desired direction of actuation. Continued heating and eventual deflection of the elongated element 110 by the constraint 120 forces the beam to "snap", i.e. to rapidly change direction, and move in the desired direction of actuation 130. The direction of the forces acting along the length of the elongated member 110 by the curvature induced by the interaction with the directional constraint 120 urge the elongated member to deform and buckle in the desired direction of actuation 130.

Figure 2D:
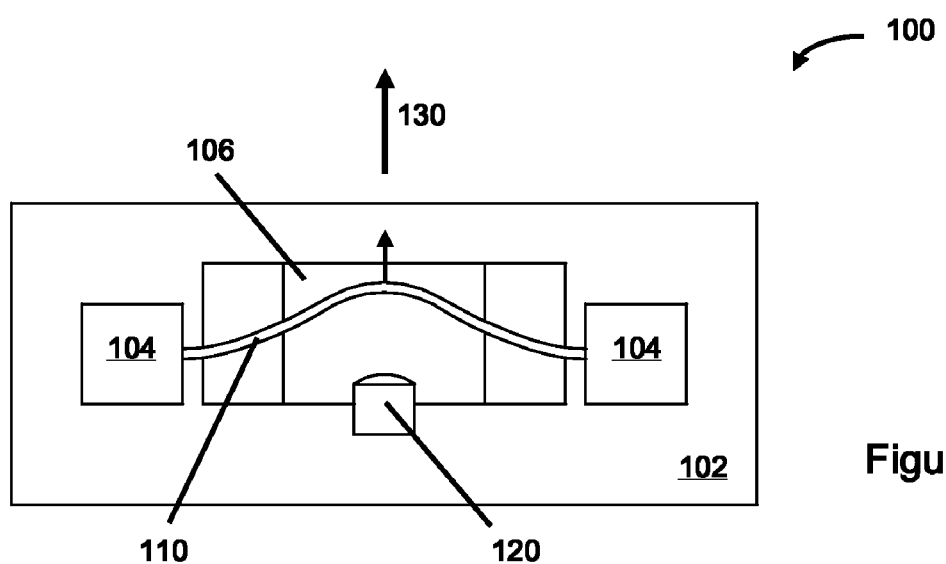
FIG. 2D is a plan schematic view of an embodiment of the MEM thermal actuator according to FIG. 2C, in an actuated state wherein the buckling direction is in the desired direction of actuation.

FIG. 2D is a plan schematic view of an embodiment of the MEM thermal actuator according to FIG. 2C, in an actuated state wherein the buckling direction is in the desired direction of actuation. Once the directional constraint 120 has forced the elongated member 110 to buckle into the desired direction of actuation 130, the elongated member 110 can achieve the desired actuated state. When the voltage ("V") is removed, resistive heating of the elongated element 110 ceases and the elongated element 110 returns to its initially straight form as illustrated in FIG. 2A. By incorporation of the directional constraint 120, MEM thermal actuator 100 is assured to produce a force and displacement, in the desired direction of actuation 130, regardless of the initial direction the elongated element 110 may buckle towards.

Figure 3A:
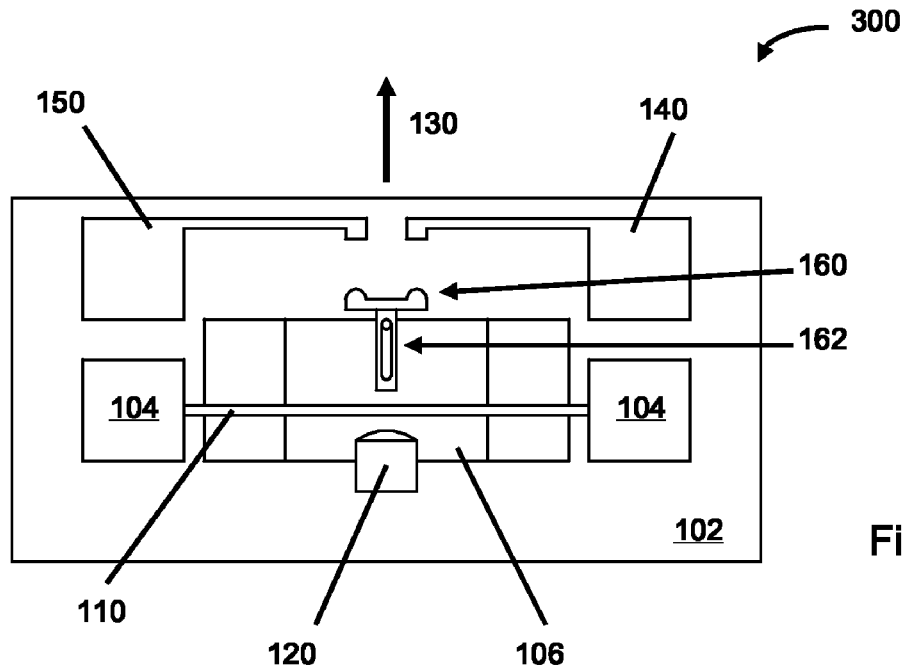
FIG. 3A is a plan schematic view of an embodiment of a MEM buckling beam thermal actuator according to the present invention, coupled to an electrical contactor in an electrically open state.

FIG. 3A is a plan schematic view of an embodiment of a MEM buckling beam thermal actuator according to the present invention, coupled to a MEM electrical contactor in an electrically open state. The principles and like numbered elements of MEM actuator 300 are as described above. In this embodiment, an elongated element 110 is mechanically coupled via a coupling device 162 to a MEM moveable electrical contactor 160. Two MEM electrical circuits 140 and 150 (e.g. conductors) are electrically isolated from each other and positioned near the contactor 162. Electrical circuits 140 and 150 can comprise conductive structures and contacts fabricated of doped polysilicon and/or metals for example. Coupling device 162 can comprise a push rod or similar movable MEM mechanical element configured to couple the force and displacement created by the movement of the buckling elongated element 110, to the moveable electrical contacts. Coupling element 162 can be fabricated of deposited and patterned layers of polysilicon and/or dielectrics such as silicon oxide and silicon nitride, and can comprise a substantially thermally and/or electrically isolated structure from the substrate 102.

Figure 3B:
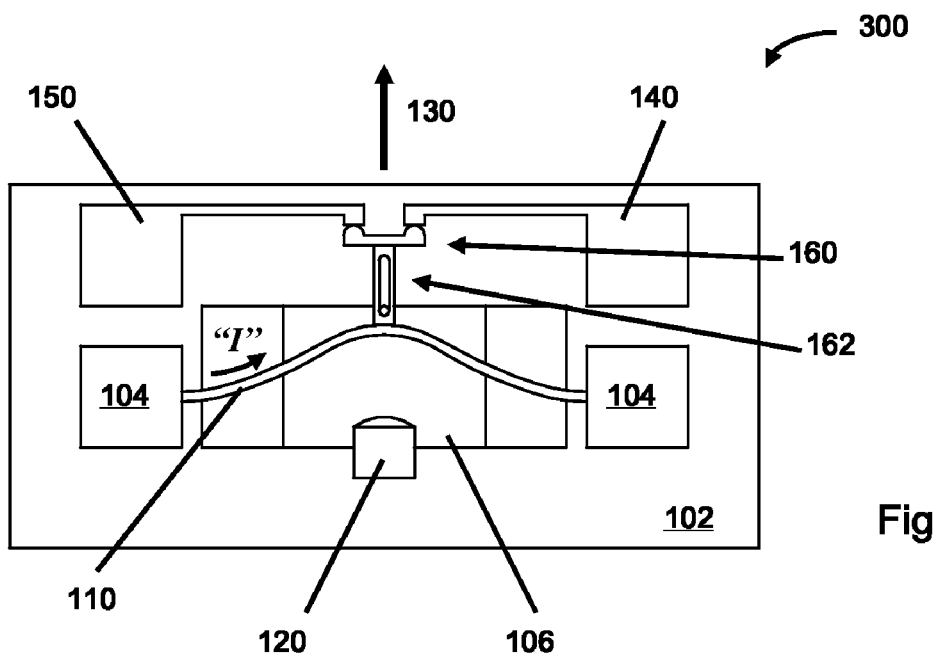
FIG. 3B is a plan schematic view of an embodiment of the MEM thermal actuator according to FIG. 3A in an actuated state, wherein the electrical contactor is in a closed state.

FIG. 3B is a plan schematic view of an embodiment of the MEM thermal actuator according to FIG. 3A in an actuated state, wherein the MEM electrical contactor is in a closed state. Applying a voltage to and inducing current ("I") to flow through the elongated element 110 causes the elongated element 110 to expand and eventually buckle in the direction of actuation 130, either with or without interaction with the directional constraint 120. Coupling element 162 is engaged by the movement of the buckling elongated element 110 and forces the electrical contactor 160 to electrically interconnect circuit elements 150 and 140. In this manner, MEM buckling thermal actuator 300 can provide utility in many applications, including as in this example, a MEM electrical switch.

Figure 4A:
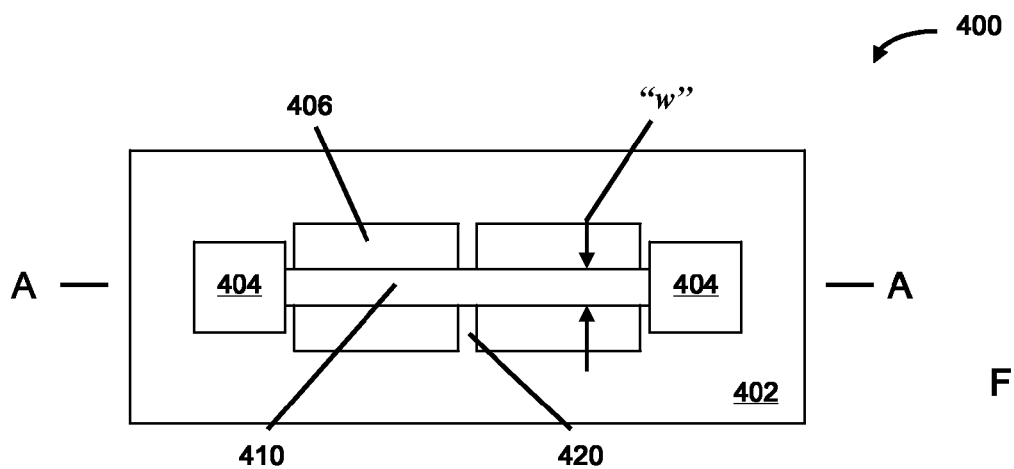
FIG. 4A is a plan schematic view of another embodiment of a MEM buckling beam thermal actuator according to the present invention.

FIG. 4A is a plan schematic view of another embodiment of a MEM buckling beam thermal actuator according to the present invention. In this exemplary embodiment, MEM buckling beam thermal actuator 400 is illustrated as fabricated by surface micromachining methods as applied to a silicon on insulator (SOI) substrate 402. Thermal actuator 400 comprises a SOI substrate 402 that can comprise two layers of single crystal silicon material separated by a dielectric (e.g. a silicon oxide). Mechanical structures are typically formed of the single crystal silicon layers by successive patterning and etching processes as described above. Supports 404 are attached to the surface of the substrate 402 and serve to support an elongated element 410 above the surface of the substrate 402. Elongated element 410 (e.g. a beam) and supports 404 can comprise patterned layers of single crystal silicon (doped or un-doped) and silicon oxide dielectric. Elongated element 410 can for example, comprise a beam of doped silicon that can function as a resistively heated element upon the passage of an electrical current through its length. In this exemplary embodiment of the invention, the elongated element 410 can comprise a single crystalline silicon beam as-fabricated in a simple straight form of uniform cross-section, electrically isolated from the substrate 402 by a dielectric layer(s) 412. As discussed below, a directional constraint element 420 is incorporated to ensure the actuator 400 provides a direction of actuation 430 in a pre-determined, i.e. desired direction.

Figure 4B:
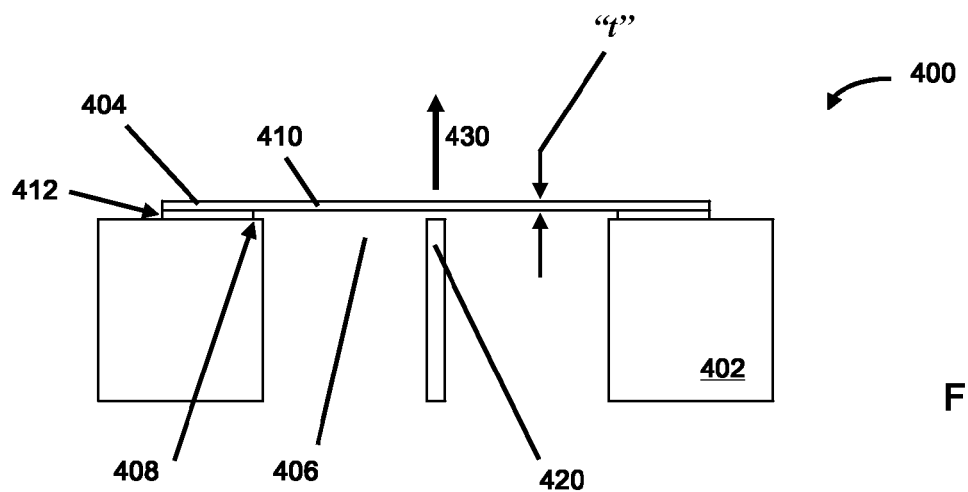
FIG. 4B is a schematic cross-sectional view of the embodiment of the MEM thermal actuator according to FIG. 4A.

FIG. 4B is a schematic cross-sectional view of an embodiment of the MEM thermal actuator according to FIG. 4A, through the section line A-A. Supports 404 disposed at each end of the elongated element 410 rigidly connect the elongated element 410 to the substrate 402 and provide for a clearance space 408 (e.g. a gap) between the elongated element 410 and the substrate 402. Supports 404 can be defined in a single crystal silicon layer (in this example, the same layer used to create the elongated element 410) and can be electrically isolated from the substrate 402 by means of a dielectric layer 412 (e.g. comprising silicon oxide). A recess 406 (e.g. an etched well or depression) can be incorporated into the substrate 402 adjacent to the elongated element 410 for the purpose of reducing thermal energy losses from the elongated element 410 to the substrate 402. Recess 406 can as well comprise a through hole or cut-out, etched through the backside of substrate 402. Comparison of FIGS. 4A and 4B illustrate that the cross-section (e.g. given by "w" and "t") of the elongated element 410 can be arranged so that the greater dimension ("w") in this embodiment, is perpendicular to the direction of actuation 430, to facilitate flexure and buckling of the elongated element 410 in the desired direction of actuation 430, e.g. out of the plane of the substrate 402.

Figure 4C:
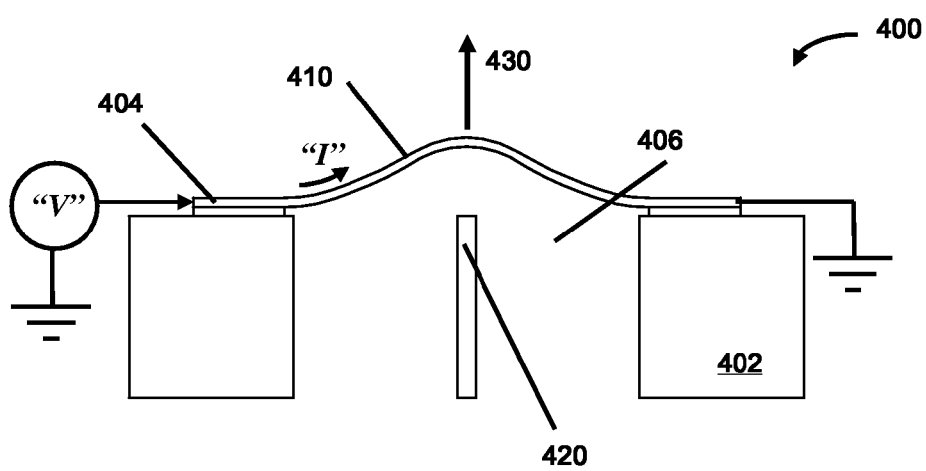
FIG. 4C is a schematic cross-sectional view of an embodiment of the MEM thermal actuator according to FIG. 4B, wherein the buckling direction of the beam is in the desired direction of actuation.

FIG. 4C is a schematic cross-sectional view of an embodiment of the MEM thermal actuator according to FIG. 4B, wherein the buckling direction of the beam is in the desired direction of actuation. Applying a voltage ("V") across the elongated element 410 for example by means of supports 404 (e.g. acting as electrical contact pads) causes an electrical current ("I") to flow through the elongated element 410 that causes the elongated element 410 to resistively heat and expand. However, as the supports 404 serve to pin the ends of the elongated element 410 to the substrate, the elongated element 410 is forced into a mechanical instability and buckles, moving the center portion of the elongated element 410 upward and in the direction of actuation 430 (i.e. out of the plane of the substrate 402). As described below, this movement of the center portion of the elongated element 410 produces a force in the actuation direction 430 which can be harnessed to perform useful work. When the voltage ("V") is removed, resistive heating of the elongated element 410 ceases and the elongated element 410 returns to its initially straight form as illustrated in FIG. 4A. Elongated element 410 could as well be heated indirectly by application of a separate resistively heated layer (e.g. the elongated element could comprise multiple layers) or by optical energy, for example by illumination from a heating lamp or a laser, or could as well be heated convectively by the flow of a heated gas over its length.

Figure 5A:
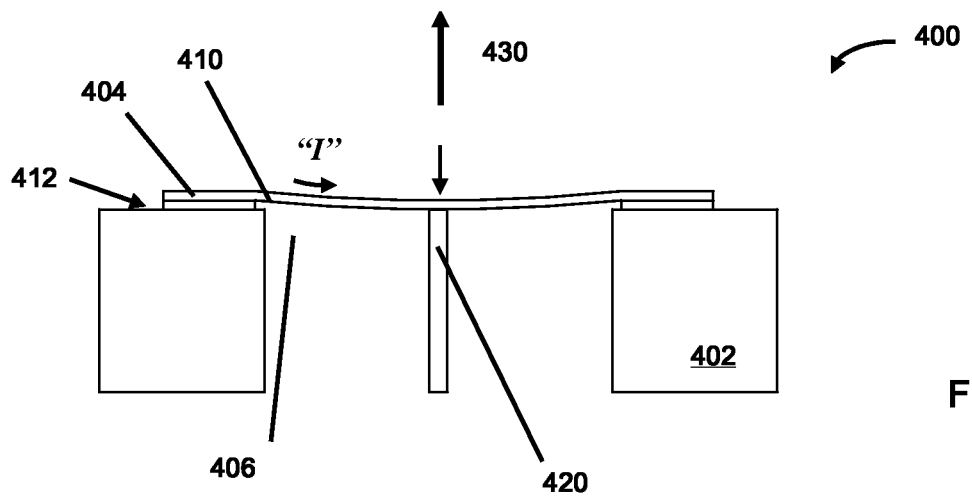
FIG. 5A is a schematic cross-sectional view of the embodiment of the MEM thermal actuator according to FIG. 4B, wherein the onset of buckling is in a direction not aligned with the desired direction of actuation.

FIG. 5A is a schematic cross-sectional view of the embodiment of the MEM thermal actuator according to FIG. 4B, wherein the onset of buckling is in a direction not aligned with the desired direction of actuation. Application of a voltage ("V", not shown) across the elongated element 410 causes current ("I") to flow through the elongated element 410 heating the elongated element 410 which expands and buckles, in a direction not aligned to the desired direction of actuation 430. Due to the pinning constraint of the supports 404, the elongated element 410 buckles downwardly and contacts the directional constraint 420. Directional constraint 420 can comprise a block or end stop affixed to the substrate 402, and can as in the example of an SOI wafer be etched from the base layer of single crystal silicon. Directional constraint 420 can comprise a substantially thermally and/or electrically isolated structure from the substrate 402. In this example, directional constraint 420 can comprise a rectangular feature with a curved or pointed surface to minimize the contact area engaging the elongated element 410. The directional constraint 420 can be positioned proximal to the center along the length of the elongated element 410, but the precise location is not critical to the practice of the invention.

Figure 5B:
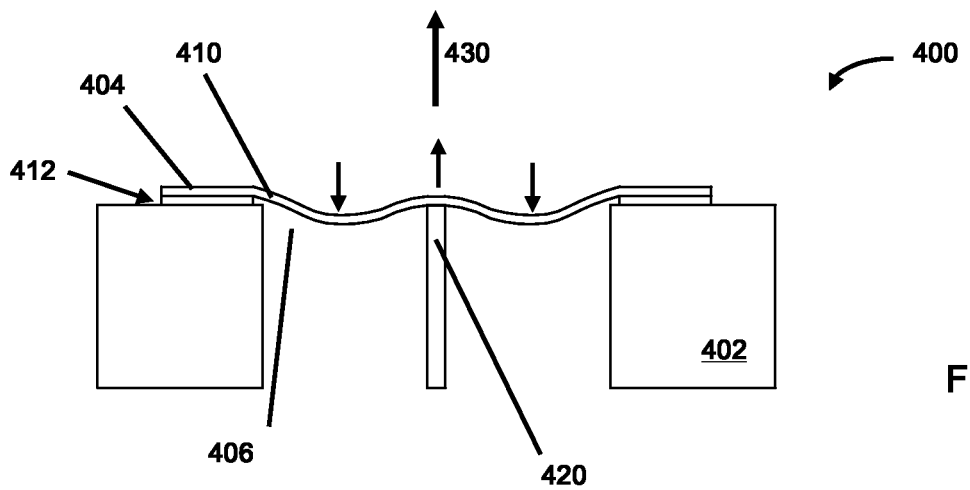
FIG. 5B is a schematic cross-sectional view of an embodiment of the MEM thermal actuator according to FIG. 5A, wherein buckling is occurring in a direction not aligned with the desired direction of actuation.

FIG. 5B is plan schematic cross-sectional view of an embodiment of the MEM thermal actuator according to FIG. 5A, wherein buckling is occurring in a direction not aligned with the desired direction of actuation. Continued heating and expansion of the elongated element 410 causes the elongated element 410 to deform over the directional constraint 420. As illustrated, the directional constraint 420 induces a reverse curvature near the center portion of the elongated element 410 thereby producing a force opposing continued motion of the elongated element 410 in the undesired direction.

Figure 5C:
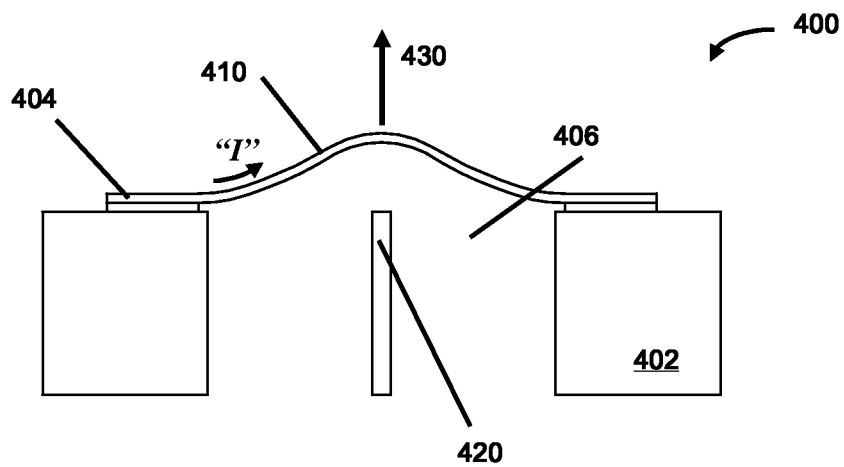
FIG. 5C is a schematic cross-sectional view of an embodiment of the MEM thermal actuator according to FIG. 5B, wherein the buckling direction has been constrained to occur in the desired direction of actuation.

FIG. 5C is a schematic cross-sectional view of an embodiment of the MEM thermal actuator according to FIG. 5A, wherein the buckling direction has been constrained (e.g. re-directed) to occur in the desired direction of actuation. Continued heating and eventual deflection of the elongated element 410 by the constraint 420 forces the beam to "snap" and move in the desired direction of actuation 430. The direction of the forces acting along the length of the elongated element 410 by the curvature induced by the interaction with the directional constraint 420 urge the elongated member to deform and buckle in the desired direction of actuation 430. When the voltage ("V") is removed, resistive heating of the elongated element 410 ceases and the elongated element 410 returns to its initially straight form as illustrated in FIG. 5A. By incorporation of the directional constraint 420, MEM thermal actuator 400 is assured to produce a force and displacement, in the desired direction of actuation 430, regardless of the initial direction the elongated element 410 expands and moves towards.

Figure 6A:
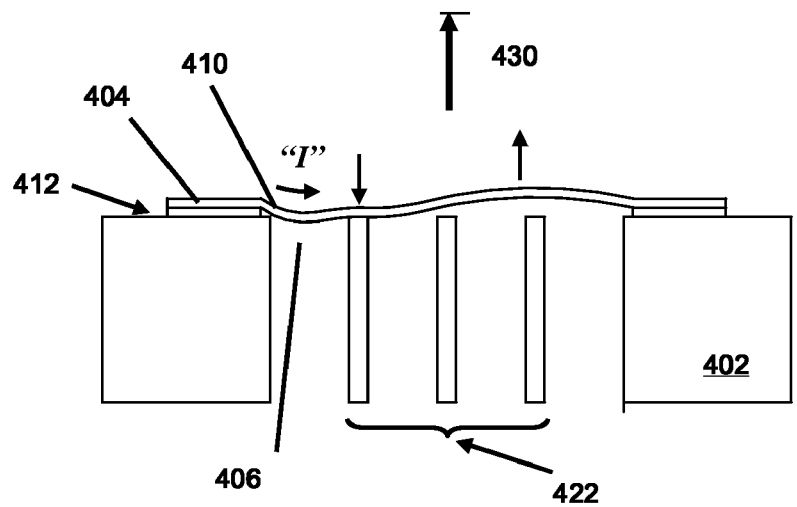
FIG. 6A is a schematic cross-sectional view of a further embodiment of a MEM thermal actuator according to the present invention, wherein the onset of buckling is in a direction not aligned with the desired direction of actuation.

FIG. 6A is a schematic cross-sectional view of a further embodiment of a MEM thermal actuator according to the present invention, wherein the onset of buckling is in a direction not aligned with the desired direction of actuation. In the examples presented above, elongated element 410 is illustrated as expanding and bucking in a "first-order" mode, i.e. exhibiting a singular radius of curvature along its length during the initial stage of expansion. However elongated element 410 can expand and buckle in a "higher-order" mode achieving for example, an "S" shape as illustrated. This can be accommodated (i.e. re-directed) by embodiments of the invention incorporating a plurality of directional constraint elements 422. Passing a current ("I") through the elongated element 410 heats the elongated element 410 which then expands and buckles, in a direction not aligned to the desired direction of actuation 430. Directional constraints 422 can comprise a block or end stop affixed to the substrate, fabricated of layers of silicon and/or dielectrics such as silicon oxide and silicon nitride, and can comprise a substantially thermally and/or electrically isolated structure from the substrate 402.

Figure 6B:
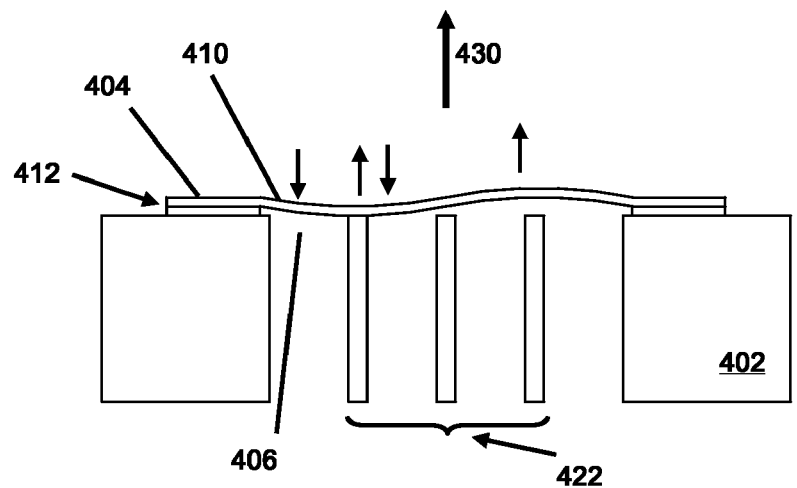
FIG. 6B is a schematic cross-sectional view of the embodiment of the MEM thermal actuator according to FIG. 6A, wherein buckling is occurring in a direction not aligned with the desired direction of actuation.

FIG. 6B is plan schematic cross-sectional view of an embodiment of the MEM thermal actuator according to FIG. 6A, wherein buckling is occurring in a direction not aligned with the desired direction of actuation. Continued heating and expansion of the elongated element 410 causes the elongated element 410 to buckle downwardly and contact the directional constraints 422, which can comprise a plurality of directional constraint elements disposed along the length of, and proximal to, the elongated element 410. As described above directional constraints 422 can comprise blocks or end stops affixed to the substrate 402, and can as in the example of an SOI wafer be etched from the base layer of single crystal silicon. As illustrated, the directional constraints 422 induce a reverse curvature in a portion of the elongated element 410 thereby producing a force opposing continued motion of the elongated element 410 in the undesired direction.

Figure 6C:
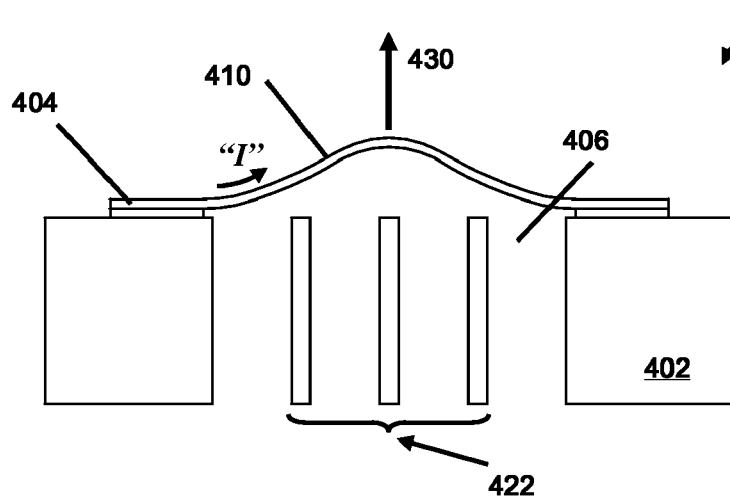
FIG. 6C is a schematic cross-sectional view of an embodiment of the MEM thermal actuator according to FIG. 6B, wherein the buckling direction has been constrained to occur in the desired direction of actuation.

FIG. 6C is a schematic cross-sectional view of an embodiment of the MEM thermal actuator according to FIG. 6A, wherein the buckling direction has been constrained (e.g. re-directed) to occur in the desired direction of actuation. Continued heating and eventual deflection of the elongated element 410 by the constraints 422 forces the beam to "snap" and move in the desired direction of actuation 430. The direction of the forces acting along the length of the elongated member 410 by the curvature induced by the interaction with the directional constraints 422 urge the elongated member to deform and buckle in the desired direction of actuation 430. When the voltage ("V") is removed, resistive heating of the elongated element 410 ceases and the elongated element 410 returns to its initially straight (e.g. un-actuated) form as illustrated in FIG. 6A.

The above described exemplary embodiments present several variants of the invention but do not limit the scope of the invention. Those skilled in the art will appreciate that the present invention can be implemented in other equivalent ways. The actual scope of the invention is intended to be defined in the following claims.

What is claimed is:

1. A microelectromechanical (MEM) buckling beam thermal actuator wherein a buckling direction of an elongated element is constrained to a desired direction of actuation, the actuator comprising:
   a substrate having a surface;
   a first and a second support attached to the surface of the substrate;
   the elongated element of substantially uniform cross-section having first and second ends, the first and second ends respectively fixedly connected to the first and second supports, the first and second supports operationally configured to support the elongated element spaced from the surface of the substrate with the elongated element being initially straight between the first and second supports;
   means for heating the elongated element thereby causing the elongated element to expand and eventually buckle; and,
   a directional constraint element fixedly attached to the substrate and disposed proximal to a midpoint of the elongated element, the directional constraint element operationally configured to constrain the buckling direction of the elongated element to the desired direction of actuation, wherein the desired direction of actuation is opposite to an initial direction towards the directional constraint element that the elongated element initially moves upon heating, by limiting movement of the elongated element in a direction which is opposite to the desired direction of actuation and re-directing the elongated element to move in the desired direction of actuation.

2. The actuator of claim 1 comprising a recess disposed in the surface of the substrate, the recess adjacent to at least a portion of the elongated element, the recess operationally configured to reduce the conduction of heat from the elongated element to the substrate.

3. The actuator of claim 1 wherein the substrate comprises a silicon substrate or a silicon on insulator (SOI) substrate.

4. The actuator of claim 3 wherein the elongated element comprises a polysilicon beam, or a single crystalline silicon beam.

5. The actuator of claim 1 wherein the directional constraint element comprises one or more selected from the group consisting of a polycrystalline silicon element, a single crystalline silicon element or a silicon oxide element.

6. The actuator of claim 1 wherein the cross section of the elongated element comprises a first dimension and a second dimension, the first dimension greater than the second dimension, the first dimension operationally configured to be perpendicular to the desired direction of actuation.

7. The actuator of claim 1 wherein the means for heating the elongated element comprises one or more heating devices selected from the group consisting of a convective heating device, an optical heating device, a laser device and a resistive heating device.

8. A microelectromechanical (MEM) buckling beam thermal actuator wherein a buckling direction of an electrically conductive beam is constrained to a desired direction of actuation, the actuator comprising:
   a substrate having a surface;
   a first and a second support attached to the surface of the substrate, the first and second supports being electrically conductive, at least one of the first and second supports being electrically isolated from the substrate;
   the electrically conductive beam of substantially uniform cross-section having first and second ends, the first and second ends respectively fixedly and electrically connected to the first and second supports, the first and second supports operationally configured to support the beam spaced from the surface of the substrate with the electrically conductive beam being initially straight between the first and second supports, the beam and the supports operationally configured to allow passing an electrical current through the beam to resistively heat the beam thereby causing the beam to expand and eventually buckle; and,
   a directional constraint fixedly attached to the substrate and disposed proximal to a midpoint of the beam, the directional constraint operationally configured to constrain the buckling direction of the beam to the desired direction of actuation, wherein the desired direction of actuation is opposite to an initial direction towards the directional constraint that the electrically conductive beam initially moves upon heating, by limiting movement of the beam in a direction which is opposite to the desired direction of actuation and re-directing the beam to move in the desired direction of actuation.

9. The actuator of claim 8 wherein the beam returns to being straight when the electrical current ceases.

10. The actuator of claim 8 wherein the beam comprises a polysilicon beam, or a single crystalline silicon beam.

11. The actuator of claim 8 wherein the substrate comprises a silicon substrate or a silicon on insulator (SOI) substrate.

12. The actuator of claim 8 comprising a recess disposed in the surface of the substrate, the recess adjacent to at least a portion of the beam, the recess operationally configured to reduce the conduction of heat from the beam to the substrate.

13. The actuator of claim 8 wherein the cross section of the beam comprises a first dimension and a second dimension, the first dimension greater than the second dimension, the first dimension operationally configured to be perpendicular to the desired direction of actuation.

14. The actuator of claim 13 wherein the desired direction of actuation is substantially parallel to the surface of the substrate.

15. The actuator of claim 13 wherein the desired direction of actuation is substantially normal to the surface of the substrate.

* * * * *